US009933486B2

(12) United States Patent
Kang (10) Patent No.: US 9,933,486 B2
(45) Date of Patent: Apr. 3, 2018

(54) APPARATUS AND METHOD OF GENERATING TEST PATTERN, TEST SYSTEM USING THE SAME, AND COMPUTER PROGRAM THEREFOR

(71) Applicant: SK hynix Inc., Icheon-si Gyeonggi-do (KR)

(72) Inventor: Jae Seok Kang, Icheon-si (KR)

(73) Assignee: SK hynix Inc., Icheon-si Gyeonggi-do (KR)

( * ) Notice: Subject to any disclaimer, the term of this patent is extended or adjusted under 35 U.S.C. 154(b) by 107 days.

(21) Appl. No.: 14/862,386

(22) Filed: Sep. 23, 2015

(65) Prior Publication Data

US 2016/0356848 A1 Dec. 8, 2016

(30) Foreign Application Priority Data

Jun. 2, 2015 (KR) ........................ 10-2015-0077876

(51) Int. Cl.
| | | |
|---|---|---|
| G06F 17/50 | (2006.01) | |
| G01R 31/319 | (2006.01) | |
| G01R 31/317 | (2006.01) | |
| G01R 31/3183 | (2006.01) | |

(52) U.S. Cl.
CPC . G01R 31/31919 (2013.01); G01R 31/31704 (2013.01); G01R 31/318314 (2013.01)

(58) Field of Classification Search
CPC ........ G01R 31/31704; G01R 31/31813; G01R 31/3183; G01R 31/318307; G01R 31/318314; G01R 31/319; G01R 31/31917; G01R 31/3119; G01R 31/31919

USPC .......................... 716/136, 106; 714/735–738
See application file for complete search history.

(56) References Cited

U.S. PATENT DOCUMENTS

| | | | | |
|---|---|---|---|---|
| 7,996,801 | B2 * | 8/2011 | Wong .................. | G06F 17/5022 716/106 |
| 2006/0031725 | A1 * | 2/2006 | Kang ............... | G01R 31/31813 714/718 |
| 2006/0277509 | A1 * | 12/2006 | Tung .................... | G06F 17/5022 716/109 |
| 2009/0307411 | A1 * | 12/2009 | GadelRab ........ | G01R 31/31855 711/103 |
| 2010/0037190 | A1 * | 2/2010 | Wong .................. | G06F 17/5022 716/106 |
| 2013/0096866 | A1 * | 4/2013 | Kemmerling .... | G01B 31/31830 702/119 |
| 2013/0110477 | A1 * | 5/2013 | Pandev .................. | G03F 7/705 703/2 |

(Continued)

FOREIGN PATENT DOCUMENTS

| | | | |
|---|---|---|---|
| JP | 08335228 A | * | 12/1996 |
| KR | 1019990079355 A | | 11/1999 |
| KR | 100939642 B1 | | 1/2010 |

*Primary Examiner* — Stacy Whitmore
(74) *Attorney, Agent, or Firm* — William Park & Associates Ltd.

(57) ABSTRACT

A test pattern generation apparatus includes an input unit, an output unit, and a pattern generating unit configured to, when a source code based on a system description language is created through the input unit, store an execution file created from the source code, generate a test pattern from the execution file according to an external command for testing a semiconductor apparatus as a DUT, and output the generated test pattern through the output unit.

20 Claims, 4 Drawing Sheets

(56) References Cited

U.S. PATENT DOCUMENTS

2016/0196123 A1* 7/2016 Fontenot ............ G06F 9/30058
717/149

* cited by examiner

APPARATUS AND METHOD OF GENERATING TEST PATTERN, TEST SYSTEM USING THE SAME, AND COMPUTER PROGRAM THEREFOR

CROSS-REFERENCES TO RELATED APPLICATION

This application claims priority under 35 U.S.C. 119(a) to Korean application No. 10-2015-0077876, filed on Jun. 2, 2015, in the Korean intellectual property Office, which is incorporated by reference in its entirety as set forth in full.

BACKGROUND

1. Technical Field

Various embodiments of the inventive concept relate to a test apparatus of a semiconductor integrated circuit, and more particularly, to an apparatus and method of generating a test pattern, a test system using the same, and a computer program.

2. Related Art

As the complexity in semiconductor integrated circuits, semiconductor chips including the same, and a system integrated with the semiconductor chips is increased, a lot of time and effort for successfully designing semiconductor apparatuses are necessary.

It is desirable to remove errors which may occur in the designed semiconductor apparatuses in a design stage before the semiconductor apparatuses are manufactured as the final products. Therefore, various methods for testing and verifying parts used in the designed semiconductor apparatuses have been studied.

The test apparatuses for the semiconductor apparatus have to perform the test on the semiconductor apparatus at speed corresponding to high integration and high speed of the semiconductor apparatuses.

To ensure reliability for the semiconductor apparatuses as a device under test (DUT), test coverage has to be increased through the modeling for various test cases.

SUMMARY

According to an embodiment, there is provided an apparatus of generating a test pattern. The apparatus may include an input unit and an output unit. The apparatus may also include a pattern generating unit configured to, when a source code based on a system description language is created through the input unit, store an execution file created from the source code, generate a test pattern from the execution file according to an external command for testing a semiconductor apparatus as a device under test (DUT), and output the generated test pattern through the output unit.

According to an embodiment, there is provided a test system. The test system may include a test pattern generation apparatus configured to, when a source code based on a system description language is created through an input unit, store an execution file created from the source code, generate a test pattern from the execution file according to an external command to test a semiconductor apparatus as a device under test (DUT), and output the test pattern through an output unit. The semiconductor apparatus as the DUT is configured to output test performing data by receiving the test pattern. The test system may also include a behavior model configured to output expected data by receiving the test pattern. The test system may also include a checker configured to compare the test performing data with the expected data.

According to an embodiment, there is provided a method of generating a test pattern. The method may include creating a source code based on a system description language. The method may also include creating an execution file from the source code. Further, the method may also include generating a test pattern from the execution file according to an external command for testing a semiconductor apparatus as a device under test (DUT).

DETAILED DESCRIPTION

Various embodiments will be described in greater detail with reference to the accompanying figures. Embodiments are described herein with reference to cross-sectional illustrations that are schematic illustrations of embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but may include deviations in shapes that result, for example, from manufacturing. In the figures, lengths and sizes of layers and regions may be exaggerated for clarity. Like reference numerals in the figures denote like elements. It is also understood that when a layer is referred to as being "on" another layer or substrate, it can be directly on the other or substrate, or intervening layers may also be present. It is also noted that in this specification, "electrically connected/coupled" refers to one component not only directly coupling another component but also indirectly coupling another component through an intermediate component. In addition, a singular form may include a plural form, and vice versa as long as it is not specifically mentioned.

The inventive concept is described herein with reference to cross-section and/or plan illustrations that are schematic illustrations of idealized embodiments of the inventive concept. However, embodiments of the inventive concept should not be limited construed as limited to the inventive concept. Although a few embodiments of the inventive concept will be shown and described, it will be appreciated by those of ordinary skill in the art that changes may be made in these embodiments without departing from the principles and spirit of the inventive concept.

Figure 1:
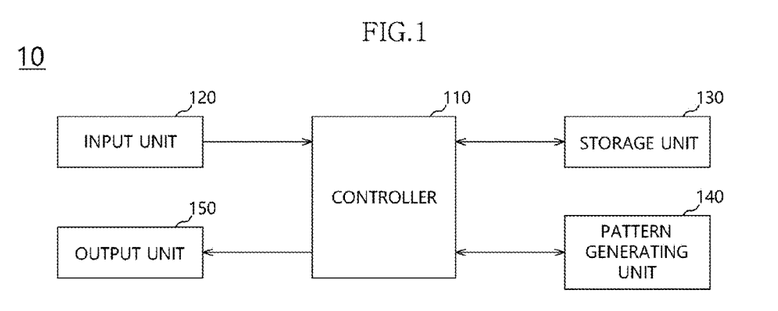
FIG. 1 is a configuration diagram illustrating a test pattern generation apparatus according to an embodiment of the inventive concept.

Referring to FIG. 1, a configuration diagram illustrating a test pattern generation apparatus according to an embodiment of the inventive concept is described.

In FIG. 1, a test pattern generation apparatus 10 may include a controller 110, an input unit 120, a storage unit 130, a pattern generating unit 140, and an output unit 150.

The controller 110 may control an overall operation of the test pattern generation apparatus 10. The controller 110 may be, for example, a central processing unit (CPU) or a microprocessor. The controller 110 may perform decryption of input commands, operation and comparison of data, data input/output (I/O) control, and the like.

The input unit 120 may be configured to provide data or a control signal input through an input device to the controller 110. The input device may be a man-machine interface device such as a keyboard, a keypad, a mouse, and the like.

The storage unit 130 may include a main storage device and an auxiliary storage device. The main storage device may store an application, a control signal, I/O data, and the like required for the operation of the test pattern generation apparatus 10. The main storage device may serve as a storage which may execute program or data by moving the program or data from the auxiliary storage device. The auxiliary storage device may be an auxiliary storage of the main storage device for storing a program code, data, and the like.

The pattern generating unit 140 may be a device which generates a test pattern to be applied to a device under test (DUT) and a behavior model.

The pattern generating unit 140 in an embodiment may generate the test pattern using a system description language. The DUT may be a gate level netlist of a semiconductor apparatus.

The pattern generating unit 140 may create and store information for a command generation sequence and an inter-command no-operation (NOP) period based on device information (design specification) of the semiconductor apparatus as the DUT in a library file. The pattern generating unit 140 may create an execution file by compiling and linking a test source code with which a pre-created library file is associated.

When an external command is input through the input unit 120, the pattern generating unit 140 may output the test pattern by inputting a decoding value of the external command to the execution file and executing the execution file.

In the test operation, the external command may be input to the input unit 120. Further, the pattern generating unit 140 may automatically generate a test command according to timing information based on the preset command generation sequence and the preset NOP period through the execution. After the priorities of test data and a test address are determined, the test data and test address may be randomly generated based on the determined priorities. The priorities of the test data and test address may be determined according to a preset criterion.

In an embodiment, the device information of the DUT may include information such as capacity, a state transition sequence, speed, timing, or a bandwidth of the semiconductor apparatus as the DUT. The command generation sequence and the inter-command NOP period for the semiconductor apparatus as the DUT may be determined based on the state transition sequence and speed defined in a design specification of a corresponding semiconductor apparatus.

For application to various DUTs, the device information, the command generation sequence, and the inter-command NOP period for semiconductor apparatuses which are to be the DUTs may be created as a source code using the system description language, and then created and stored in a library file.

When the test source code for a specific DUT is created, the pattern generating unit 140 may create the execution file by associating the device information, the command generation sequence, and the inter-command NOP period on which the library is performed with the test source code, and compiling and linking the test source code.

The system description language may be a high-level language. The system description language may be an object-oriented programming language such as C language or C++ language.

The output unit 150 may receive an operation status, a processing status, a processing result, and the like of the test pattern generation apparatus 10 from the controller 110 and output the operation status, the processing status, the processing result, and the like through an output device. The output device may be a man-machine interface device such as a display or a speaker.

In an embodiment, the input unit 120 and the output unit 150 may further include an interface which may exchange data and a control signal with the DUT, a behavior model, and other external apparatuses.

Figure 2:
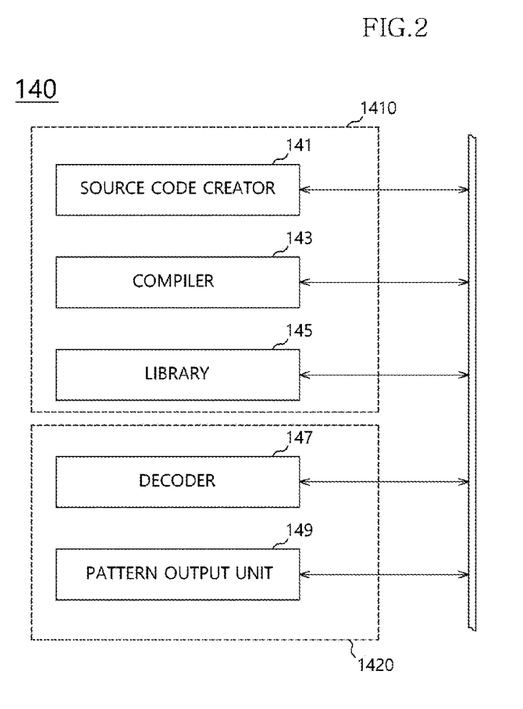
FIG. 2 is a configuration diagram illustrating a pattern generating unit according to an embodiment of the inventive concept.

Referring to FIG. 2, a configuration diagram illustrating a pattern generating unit according to an embodiment of the inventive concept is described.

In FIG. 2, the pattern generating unit 140 may include a source code creator 141, a compiler 143, a library 145, a decoder 147, and a pattern output unit 149.

The source code creator 141 may provide an environment which may create a source code which describes the device information, the command generation sequence, and the inter-command NOP period, and the like for the DUT. The developer or test performer may create a device information source code, a command generation source code, and an inter-command NOP generation source code through the input unit 120 of the test pattern generation apparatus 10. The command generation sequence and the inter-command NOP period, and the like may be created to satisfy a design specification of a corresponding DUT based on the device information (device specification).

The source code creator 141 may provide an environment which may create a test source code with which the library file is associated.

In an embodiment, the source code creator 141 may provide the environment which creates the source code through the system description language. The system description language may be a high-level language. The system description language may also be an object-oriented programming language.

The compiler 143 may compile the device information source code, the command generation source code, and the inter-command NOP generation source code created in the source code creator 141 to a library file. The library file created in the compiler 143 may be stored in the library 145.

The compiler 143 may convert the test source code with which the library file is associated to an object code by compiling the test source code. The compiler 143 may create the execution file by linking the test source code and the library file associated with the test source code.

The decoder 147 may decode an external command provided through the input unit 130 in the test operation.

The pattern output unit 149 may generate a test pattern by applying the external command decoded in the decoder 147 to the execution file and executing the execution file.

In an embodiment, the source code creator 141, the compiler 143, and the library 145 may be referred to as an execution file creator 1410. The execution file creator 1410 may be implemented inside a computing apparatus separately from the test pattern generation apparatus 10.

In an embodiment, the decoder 147 and the pattern output unit 149 may be referred to as a pattern generator 1420.

It has described that the command generation sequence and the inter-command NOP period for the test may be created on the basis of the state transition sequence defined in the design specification of the semiconductor apparatus as the DUT.

Figure 3:
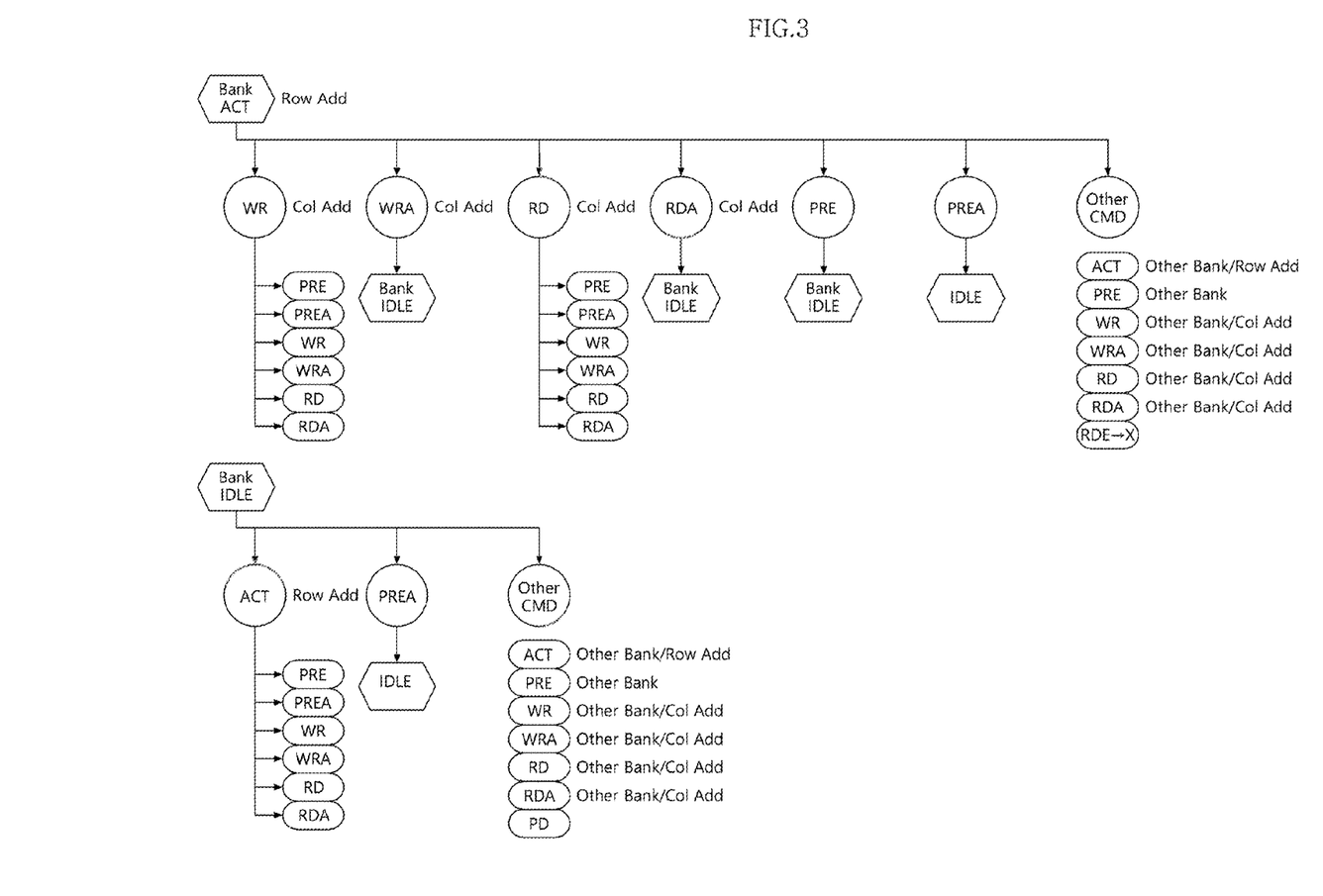
FIG. 3 is an illustrative diagram illustrating a state transition diagram of a semiconductor apparatus according to an embodiment of the inventive concept.

Referring to FIG. 3, an illustrative diagram illustrating a state transition diagram of a semiconductor apparatus according to an embodiment of the inventive concept is described.

In an embodiment, the semiconductor apparatus may receive a bank active command Bank ACT together with a row address Row Add. The semiconductor apparatus may then receive a write command WR, a write and auto precharge command WRA, a read command RD, and a read and auto precharge command RDA together with a column address Col Add, a precharge command PRE, an all precharge command PREA, and other commands other CMD.

After the bank active command Bank ACT is received, and then the write command WR is received, the semiconductor apparatus may receive the precharge command PRE, the all precharge command PREA, the write command WR, the write and auto precharge command WRA, the read command RD, and the read and auto precharge command RDA.

After the bank active command Bank ACT is received, and then the write and auto precharge command WRA, the read and auto precharge command RDA, or the precharge command PRE is received, the semiconductor apparatus may transit to a bank idle state Bank IDLE.

After the bank active command Bank ACT is received, and then the read command RD is received, the semiconductor apparatus may receive the precharge command PRE, the all precharge command PREA, the write command WR, the write and auto precharge command WRA, the read command RD, and the read and auto precharge command RDA.

After the bank active command Bank ACT is received, and then the all precharge command PREA is received, the semiconductor apparatus may transit to an idle state IDLE.

After the bank active command Bank ACT is received, and then the other commands Other CMD are received, the semiconductor apparatus may receive the active command ACT, the precharge command PRE, the write command WR, the write and auto precharge command WRA, the read command RD, and the read and auto precharge command RDA for another bank, and a power-down release command after power-down entering PDE→X.

After the bank idle command Bank IDLE is received, the semiconductor apparatus may receive the active command ACT together with the row address Row Add. In the alternative, the semiconductor apparatus may receive the all precharge command PREA and other commands Other CMD.

After the bank idle command Bank IDLE is received, and then the active command ACT is received, the semiconductor apparatus may receive the precharge command PRE, the all precharge command PREA, the write command WR, the write and auto precharge command WRA, the read command RD, and the read and auto precharge command RDA.

After the bank idle command Bank IDLE is received, and then the all precharge command PREA is received, the semiconductor apparatus may transit to an idle state IDLE.

After the bank idle command Bank IDLE is received, and then the other commands Other CMD are received, the semiconductor apparatus may receive the active command ACT, the precharge command PRE, the write command WR, the write and auto precharge command WRA, the read command RD, and the read and auto precharge command RDA for another bank, and a power-down command PD.

The semiconductor apparatuses may have state transition sequences different from each other according to design specifications.

In an embodiment, the command generation sequence is created in a library file based on the state transition sequence defined in the design specification of the semiconductor apparatus as the DUT. Further, the information for the inter-command NOP period is created in a library file based on speed information and the state transition sequence defined in the design specification of the semiconductor apparatus. The test source code may refer to the library file for the command generation sequence and the library file for the inter-command NOP period.

When the library files are created according to the semiconductor apparatuses as the DUT, the test code may be created only with reference to the corresponding library file. Accordingly, the test pattern generation may be automated.

The state transition diagram illustrated in FIG. 3 is merely an example. Further, the state transition sequence may be changed according to the kind of the semiconductor apparatus as the DUT.

Figure 4:
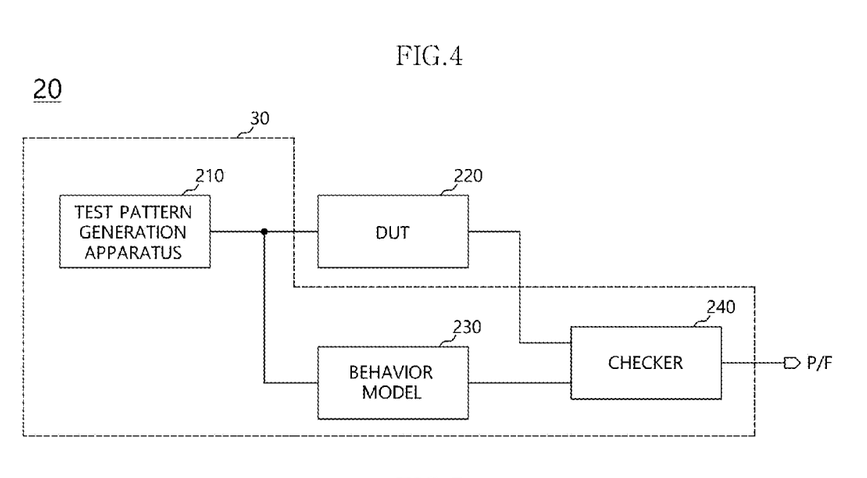
FIG. 4 is a configuration diagram illustrating a test system according to an embodiment of the inventive concept.

Referring to FIG. 4, a configuration diagram illustrating a test system according to an embodiment is illustrated.

In FIG. 4, a test system 20 may include a test pattern generation apparatus 210, a DUT 220, a behavior model 230, and a checker 240.

The test pattern generation apparatus 210 may include the device information source code, the command generation source code, and the inter-command NOP generation source code, which are created in the system description language, in the library file as described with reference to FIGS. 1 to 3. The test pattern generation apparatus 210 may create the execution file by compiling and linking the test source code with which the pre-created library file is associated. When an external command is input in the test operation, the test pattern generation apparatus 210 may create the test pattern by decoding the external command and applying the decoded external command to the execution file.

The test pattern generation apparatus 210 have been described above. Accordingly, a detailed description thereof will be omitted.

The DUT 220 may be a gate level netlist of the semiconductor apparatus. The test pattern generated in the test pattern generation apparatus 210 may be input to the DUT 220. Further, test performing data as a processing result may be output from the DUT 220.

The behavior model 230 may describe the operation of the DUT 220 based on the grammar of the preset programming language. In addition, when the test pattern generated in the test pattern generation apparatus 210 is input, the behavior model 230 may output expected data in response to the test pattern.

In an embodiment, the behavior model 230 may describe the operation of the DUT 220 in the system description language or the hardware description language.

The checker 240 may perform the test by comparing the test performing data provided from the DUT 220 with the expected data provided from the behavior model 230. The checker 240 may also generate a pass signal P or a failure signal F as the test result.

The behavior model 230 and the checker 240 may be provided inside or outside the test pattern generation apparatus 210. A test pattern generation apparatus 30 may be implemented to include the test pattern generation apparatus 210, the behavior model 230, and the checker 240.

Figure 5:
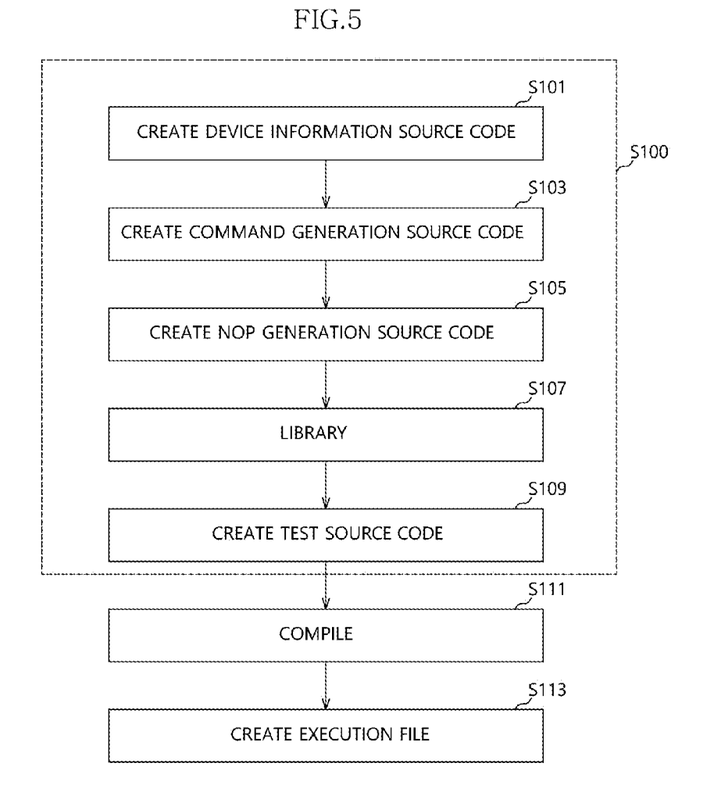
FIG. 5 is a flowchart illustrating a test pattern generation method according to an embodiment of the inventive concept.

Referring to FIG. 5, a flowchart illustrating a test pattern generation method according to an embodiment is illustrated.

The test pattern generation method may include a source code creation process S100, a compiling process S111, and an execution file creation process S113.

The source code creation process S100 will be described in detail.

The developer or the test performer may access the test pattern generation apparatus 10 through the input unit 120. The developer or the test performer may also create a device information source code, a command generation source code, and an inter-command NOP generation source code in an environment provided from the source code creator 141 of the test pattern generation apparatus 10 (S101, S103, S105).

The device information of the DUT may include information such as capacity, a state transition sequence, speed, timing, or a bandwidth defined in the design specification of the semiconductor apparatus as the DUT. The command generation source code and inter-command NOP generation source code for the semiconductor apparatus as the DUT may be created to satisfy the state transition sequence and speed defined in a design specification of a corresponding semiconductor apparatus.

As the source codes are created in operations S101 to S103, the compiler 143 of the test pattern generation apparatus 10 may create and store the source codes in a library file by compiling the source codes (S107).

When the library files are created based on the design specification of the DUT, a test source code which defines test algorithm for the DUT may be created (S109). The test source code may be created so that the pre-created library file is associated with the test source code. The developer or the test performer may create the test source code in the environment provided from the source code creator 141 of the test pattern generation apparatus 10.

In an embodiment, the device information source code, the command generation source code, and the inter-command NOP generation source code may be created through a system description language. The system description language may be may be a high-level language, for example, an object-oriented programming language.

When the source codes are created, the compiler 143 may convert the test source code with which the library file is associated to an object code by compiling the test source code (S111). The compiler 143 may also create an execution file by linking the test source code and the library file associated with the test source code (S113).

After the execution file is created, the test for the DUT 220 may be performed. The test method will be described with reference to FIG. 6.

Figure 6:
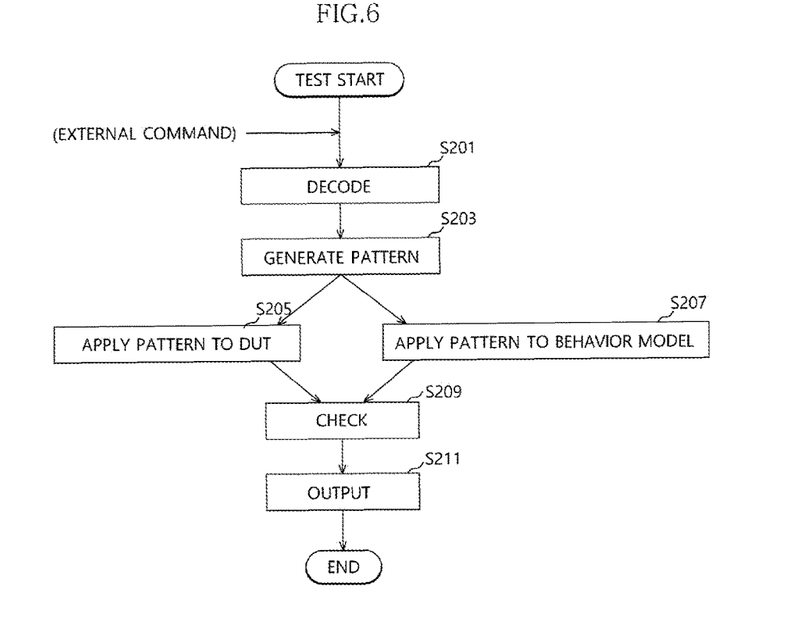
FIG. 6 is a flowchart illustrating a test method according to an embodiment of the inventive concept.

Referring to FIG. 6, a flowchart illustrating a test method according to an embodiment is illustrated.

When the test mode starts and an external command is input, the decoder 147 of the test pattern generation apparatus 10 may decode the external command (S201).

The pattern output unit 149 of the test pattern generation apparatus 10 may generate a test pattern by applying the external command decoded in the decoder 147 to the execution file and executing the execution file (S203).

The test pattern generated in operation S203 may be provided to the DUT 220 and the behavior model 230 (S205 and S207). As a result, test performing data may be output from the DUT 220. Further, expected data may be output from the behavior model 230.

The test performing data and expected data may be provided to the checker 240. In addition, the checker 240 may compare the test performing data with the expected data (S209). The checker 240 may output a test result signal (S211).

The test source code may be created with reference to the library file in which the command generation sequence and the inter-command NOP period are defined according to the design specification of the semiconductor apparatus as the DUT. Further, the library file and the test source code may be created in the system description language, for example, the object-oriented programming language. Therefore, various types of test patterns may be generated by pre-defining the library files according to the DUTs 220, and creating the test source codes associated with the library files. Accordingly, the test coverage may be improved. Further, the development time of the test pattern generation program may be reduced.

Figure 7:
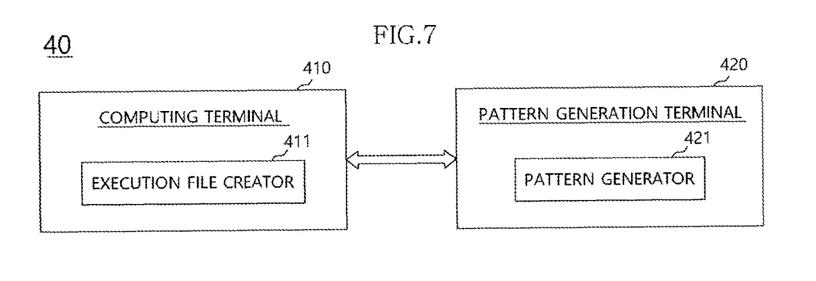
FIG. 7 is a configuration diagram illustrating a test pattern generation apparatus according to an embodiment of the inventive concept.

Referring to FIG. 7, a configuration diagram illustrating a test pattern generation apparatus according to an embodiment is illustrated.

In FIG. 7, a test pattern generation apparatus 40 may include a computing terminal 410 and a pattern generation terminal 420.

The computing terminal 410 may include an execution file creator 411. The execution file creator 411 may include a source code creator 141, a compiler 143, and a library 145 as illustrated in FIG. 2.

The developer or the test performer may create a library file and a test source code using the computing terminal 410. Further, the computing terminal 410 may create an execution file for a test by compiling and linking the library file and the test source code.

The created execution file may be provided to the pattern generation terminal 420 and used in the test.

The pattern generation terminal 420 may include the pattern generator 421. The pattern generator 421 may include a decoder 147 and a pattern output unit 149 as illustrated in FIG. 2.

After an external command is input to the pattern generation terminal 420 to which the execution file is provided, and is decoded, the decoded external command may be applied to the execution file. Further, the execution file to which the decoded external command is applied may be created as the test pattern.

In an embodiment, the execution file created in the computing terminal 410 may be computer program which may be executed in the pattern generation terminal 420.

In an embodiment, the computing terminal 410 and the pattern generation terminal 420 may be electrically coupled through a wired or wireless communication network. Further, the execution file of the computing terminal 410 may be transmitted to the pattern generation terminal 420. In an embodiment, the execution file created in the computing terminal 410 may transfer to the pattern generation terminal 420 via a separate storage medium.

The above embodiment of the invention is illustrative and not limitative. Various alternatives and equivalents are possible. The invention is not limited by the embodiments described herein. Nor is the invention limited to any specific type of semiconductor device. Other additions, subtractions, or modifications are obvious in view of the invention and are intended to fall within the scope of the appended claims.

What is claimed is:

1. An apparatus of generating a test pattern, the apparatus comprising:
   an input circuit;
   an output circuit; and
   a pattern generating circuit configured to, when a source code based on a system description language is created through the input circuit, store an execution file created from the source code, generate a test pattern from the execution file according to an external command for testing a semiconductor apparatus as a device under test (DUT), and output the generated test pattern through the output circuit,
   wherein the source code includes:
   a device information source code which describes a design specification of the semiconductor apparatus as the DUT;
   a command generation source code based on the design specification; and
   a no-operation (NOP) generation source code based on the design specification,
   wherein the pattern generating circuit is configured to create and store the device information source code, the command generation source code, and the NOP generation source code in a library file,
   wherein the design specification of the semiconductor apparatus as the DUT includes capacity, a state transition sequence, speed, and timing of the semiconductor apparatus as the DUT.

2. The apparatus of claim 1, wherein the source code further includes a test source code which is associated with the library file, and defines test algorithm for the semiconductor apparatus as the DUT, and
   the pattern generating circuit is configured to create the execution file by compiling and linking the test source code.

3. The apparatus of claim 1, wherein the command generation source code is described based on the state transition sequence of the semiconductor apparatus as the DUT, and
   the NOP generation source code is described based on the state transition sequence and speed of the semiconductor apparatus as the DUT.

4. The apparatus of claim 1, wherein the system description language is an object-oriented programming language.

5. The apparatus of claim 1, wherein the pattern generating circuit includes:
   an execution file creator configured to create a library file from a device information source code which describes a design specification of the semiconductor apparatus as the DUT, a command generation source code based on the design specification, and a no-operation (NOP) generation source code based on the design specification, and create the execution file by compiling and linking a test source code which is associated with the library file, and defines a test algorithm for the semiconductor apparatus as the DUT; and
   a pattern generator configured to output the test pattern by decoding the external command and executing the execution file according to the decoded external command.

6. The apparatus of claim 5, wherein the execution file creator includes:
   a source code creator configured to provide an environment capable of creating the device information source code, the command generation source code, the NOP generation source code, and the test source code; and
   a compiler configured to compile the device information source code, the command generation source code, and the NOP generation source code created in the source code creator to the library file, and create the execution file by compiling the test source code and linking the compiled test source code with the library file.

7. The apparatus of claim 5, wherein the pattern generator includes:
   a decoder configured to decode the external command; and
   a pattern output circuit configured to generate the test pattern by executing the execution file according to the decoded external command.

8. The apparatus of claim 5, wherein the execution file creator is included in a computing apparatus separately from the pattern generator.

9. The apparatus of claim 1, wherein the pattern generating circuit is configured to generate the test pattern using a system description language.

10. The apparatus of claim 1, wherein in a test operation, the pattern generating circuit automatically generates a test command in response to timing information based on a preset command generation sequence and a preset inter-command no-operation (NOP) period.

11. A test system comprising:
    a test pattern generation apparatus configured to, when a source code based on a system description language is created through an input circuit, store an execution file created from the source code, generate a test pattern from the execution file according to an external command to test a semiconductor apparatus as a device under test (DUT), and output the test pattern through an output circuit;
    the semiconductor apparatus as the DUT configured to output test performing data by receiving the test pattern;
    a behavior model circuit configured to output expected data by receiving the test pattern; and
    a checker circuit configured to compare the test performing data with the expected data,
    wherein the source code includes:
    a device information source code which describes a design specification of the semiconductor apparatus as the DUT;
    a command generation source code based on the design specification; and
    a no-operation (NOP) generation source code based on the design specification,
    wherein the pattern generating circuit is configured to create and store the device information source code, the command generation source code, and the NOP generation source code in a library file,
    wherein the design specification of the semiconductor apparatus as the DUT includes capacity, a state transition sequence, speed, and timing of the semiconductor apparatus as the DUT.

12. The test system of claim 11, wherein the semiconductor apparatus as the DUT is a gate level netlist.

13. The test system of claim 11, wherein the source code further includes a test source code associated with the library file and defines a test algorithm for the semiconductor apparatus as the DUT, and
the test pattern generation apparatus is configured to create the execution file by compiling and linking the test source code.

14. The test system of claim 11, wherein the command generation source code is described based on the state transition sequence of the semiconductor apparatus as the DUT, and
the NOP generation source code is described based on the state transition sequence and speed of the semiconductor apparatus as the DUT.

15. The test system of claim 11, wherein the system description language is an object-oriented programming language.

16. A method of generating a test pattern, the method comprising:
creating a source code by an input circuit based on a system description language;
creating an execution file from the source code;
generating a test pattern from the execution file according to an external command for testing a semiconductor apparatus as a device under test (DUT); and
outputting the generated test pattern through an output circuit,
wherein the creating of the source code includes:
creating a device information source code which describes a design specification of the semiconductor apparatus as the DUT;
creating a command generation source code based on the design specification;
creating a no-operation (NOP) generation source code based on the design specification;
creating and storing the device information source code, the command generation source code, and the NOP generation source code in a library file; and
creating a test source code associated with the library file, and defines a test algorithm for the semiconductor apparatus as the DUT,
wherein the design specification of the semiconductor apparatus as the DUT includes capacity, a state transition sequence, speed, and timing of the semiconductor apparatus as the DUT.

17. The method of claim 16, wherein the creating of the execution file includes compiling and linking the test source code.

18. The method of claim 16, wherein the command generation source code is created based on the state transition sequence of the semiconductor apparatus as the DUT, and
the NOP generation source code is created based on the state transition sequence and the speed of the semiconductor apparatus as the DUT.

19. The method of claim 16, wherein the generating of the test pattern includes:
decoding the external command; and
executing the execution file according to the decoded external command.

20. The method of claim 16, wherein the system description language is an object-oriented programming language.

* * * * *